United States Patent [19]

Miller et al.

[11] Patent Number: 5,701,133
[45] Date of Patent: Dec. 23, 1997

[54] CASCADED MULTIPLYING CURRENT MIRROR DRIVER FOR LED'S

[75] Inventors: Gabriel L. Miller, Westfield; Eric R. Wagner, South Plainfield, both of N.J.

[73] Assignee: Lucent Technologies Inc., Murray Hill, N.J.

[21] Appl. No.: 322,886

[22] Filed: Oct. 13, 1994

[51] Int. Cl.[6] ................................................ G09G 3/00
[52] U.S. Cl. ................................................ 345/46
[58] Field of Search ................................ 345/211, 82, 46

[56] References Cited

U.S. PATENT DOCUMENTS 4,417,240  11/1983  Ahmed ............................. 345/82

Primary Examiner—Mark R. Powell

[57] ABSTRACT

A circuit for driving light emitting diodes with a precise amount of current in response to an input pulse is disclosed. The input pulse drives a transistor into saturation, and the collector current of this transistor is increased in value through the use of two cascaded multiplying current mirrors. The second current mirror directly drives the light emitting diodes.

9 Claims, 1 Drawing Sheet

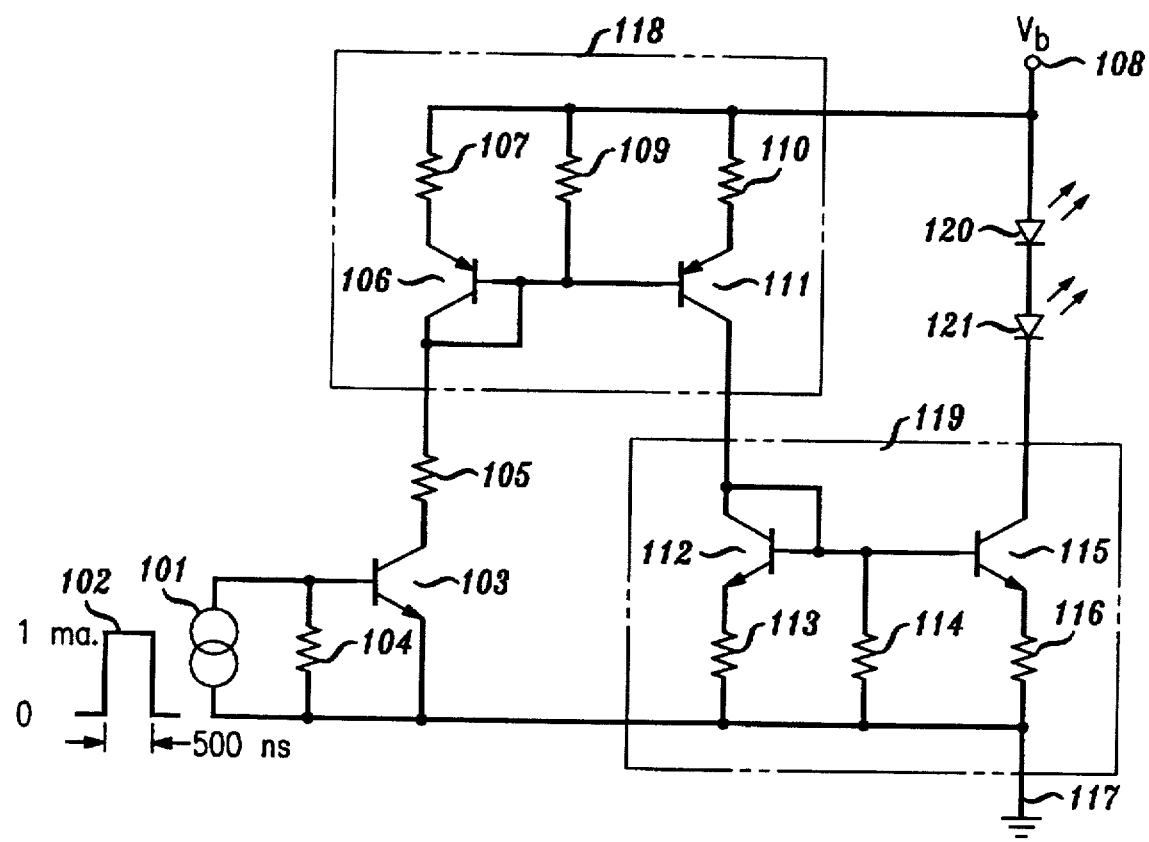

CASCADED MULTIPLYING CURRENT MIRROR DRIVER FOR LED'S

FIELD OF THE INVENTION

This invention relates to a driver circuit for light emitting diodes (LED's) and more particularly to a driver circuit for LED's that can be used in a hand held device which is part of a communications system.

DESCRIPTION OF THE RELATED ART

LED's have been used as light emitting sources for many types of communications systems involving optical fibers. All of these systems are powered by voltage or current sources that can be made relatively stable with time. Accordingly, the optical output from the LED in such system does not change with time except for the changes that may result from the deterioration of the LED.

LED's are used in hand-held battery-powered devices of the type that are used to remotely control television sets and video cassette recorders (VCR's). In these devices, the LED's are simply placed in series with a transistor switch and a resistor across the battery that is used to power the device. The transistor switch is triggered on and off by appropriate codes in order to remotely control the desired apparatus. When the battery is new, the LED's produce high optical output power, but as the battery discharges the optical power degrades rapidly. (This is because the current that flows though an LED depends roughly exponentially on the applied driving voltage. Consequently even a small reduction in driving voltage, produced by battery use and aging, can result in a large reduction in light output.) These remote controllers, however, are only used to produce short output bursts of optical power, and as a result do not rapidly discharge the battery. If the LED's are to be used in a communications system wherein the LED's must provide optical output power over extended periods of time, the simple approach of driving the LED's with a transistor switch in series with a resistor directly from the battery is not desirable since the battery would be rapidly discharged and the system would fail due to inadequate optical output power. It would be much more desirable to supply the LED's with a relatively constant current throughout the life of the battery. This would not only ensure a longer life for the battery, but would also provide a communications system which is more dependable in its performance.

SUMMARY OF THE INVENTION

The problem of providing an LED driver circuit which is capable of producing relatively stable optical output power from a battery-powered hand-held device over the life of the battery is solved in accordance with the present invention wherein the LED's are driven by cascaded multiplying current mirrors. The information to be transmitted is coupled in the form of input pulses to the base of a switching transistor. This switching transistor when turned on (driven into saturation) by an input pulse develops a reference current in the first one of two multiplying current mirrors. The output current of this first current mirror is used as the reference current in the second multiplying mirror, and the current developed by the second multiplying current mirror is the current used to drive the LED's.

It is an aspect of the present invention that the first and second current mirrors are constructed of complementary transistor types. As a result, the output transistor of the first current mirror can be placed in series with the input transistor (connected as a diode) of the second current mirror across the battery supply. As a result of the invention, a simple, quite efficient LED driver circuit can be constructed to provide a well defined LED drive current over the life of the battery, and this circuit is capable of delivering drive pulses to the LED's at a very fast rate, up to many megabits per second.

BRIEF DESCRIPTION OF THE DRAWING

FIG. 1 is a schematic diagram of a LED driver circuit constructed in accordance with the present invention.

DESCRIPTION OF THE PREFERRED EMBODIMENT

In FIG. 1, the input data is shown symbolically as coming from a current source 101. As indicated by a representative pulse 102 in FIG. 1, each input pulse delivers approximately 1 milliamp (ma.) of drive current to the base electrode of an NPN transistor 103. A small fraction of the input current also flows through the resistor 104, but this does not significantly affect the over all action of the circuit. The emitter electrode of transistor 103 is also connected to ground potential 117, and each input pulse causes transistor 101 to be turned on and driven into saturation. A resistor 104, connected between the base electrode of transistor 103 and ground potential 117, permits transistor 103 to be rapidly turned off when the input pulse is terminated and current source 101 is delivering zero current to the base electrode.

The collector electrode of transistor 103 is connected through a resistor 105 to the collector and base electrodes of a transistor 106, the emitter electrode of which is connected through a resistor 107 to terminal 108 which is connected to the positive terminal of a battery having a potential of $+V_b$, the negative terminal of the battery being connected to ground potential 117. In the present embodiment, the hand-held device is powered by three 1.5 volt AA batteries connected in series, and the initial battery voltage $V_b$ is therefore equal to about 4.5 volts. The circuit was determined to operate until the batteries were discharged to a potential of about 3.5 volts, and the nominal voltage of about +4.0 volts is therefore connected to terminal 108.

As indicated herein above and in FIG. 1 transistor 106 is connected as a diode, and when transistor 103 is driven into saturation by the input data pulse, current is drawn from terminal 108 through resistor 107, transistor 106, and resistor 105 by an amount dependent primarily on the value of the battery voltage $V_b$ and the sum of the values of resistors 105 and 107. The voltage across the diode-connected transistor 106 is roughly 0.7 volts, while the saturation voltage drop across transistor 103 is typically less than 0.1 volt, both being small compared with the battery voltage $V_b$. In the present embodiment, the current flowing through resistor 105 when transistor 103 is turned on is nominally equal to about 1.6 ma.

The base electrode of transistor 106 is connected to the base electrode of a transistor 111 whose emitter electrode is connected through a resistor 110 to positive potential source 108. Transistor 111 is of the same type as transistor 106 and therefore has matching characteristics. Those skilled in the art will recognize the components within dotted enclosure 118 as a current mirror. If resistors 107 and 110 are caused to be equal in value the current flowing out of the collector of transistor 111 is equal in value to the current drawn out of the collector of transistor 106. In the present embodiment resistor 110 has a value of one sixth (⅙) the value of resistor 107 and under these circumstances, the current flowing out of the collector of transistor 111 is six times the current flowing out of the collector of transistor 106 or about (6×1.6 ma.=) 9 ma. Due to this multiplication action the components within dotted enclosure 118 are called a multiplying current mirror for which the current out of the collector of transistor 106 is the reference current and the current out of the collector of transistor 111 is the output current. This multiplication action of the current mirror (ratio of the output current to reference current) can also be described as current mirror gain. As long as the gain of the current mirror stage is much less than the β of the transistors being used, this gain can be represented by the simple ratio of the resistors, R107/R110. Those skilled in the art will recognize that while discrete transistors are described for 106 and 111 in this description, it is also possible to produce completely integrated multiplying current mirrors. These are typically produced by simply scaling the areas of transistors 106 and 111 to produce the required multiplying action. Resistors 107 and 110 are then not needed.

To obtain the desired optical output power from the two LED's to be described herein after it was determined that they should be driven by about 80 ma. To translate the 1.6 ma. of drive current from transistor 103 into 80 ma. in a single current mirror would require that the current mirror have a gain of about 50. This would be theoretically possible if the transistors had extremely large β's (of the order of 500 or more), but with real transistors, having a β of about 100, the present invention advantageously uses a second stage of multiplying current mirror.

The current out of the collector of transistor 111 is coupled to the collector electrode of a transistor 112 whose emitter electrode is connected to ground potential 117 via resistor 113. The collector of transistor 112 is also connected to its base electrode and to the base electrode of a transistor 115. The emitter electrode of transistor 115 is connected through a resistor 116 to ground potential, and those skilled in the art will also recognize the components 112, 113, 115, and 116 as making up a current mirror (dotted enclosure 119) wherein the collector current of transistor 115 is related to the collector current of transistor 112. In the present embodiment, the value of resistor 116 is equal to about one tenth the value of resistor 113, and current mirror 119 is also a multiplying current mirror. Since about 8 ma. of the 9 ma. out of the collector of transistor 111 flows into the collector electrode of transistor 112, the current flowing into the collector of transistor 115 is about 10×8=80 ma.

Resistor 109 is connected between the base electrodes of transistors 106 and 111 and terminal 108 in order to permit these transistors to be rapidly turned off when transistor 103 is taken out of saturation by the input drive current turning off. Similarly, a resistor 114 is connected between the base electrodes of transistors 112 and 115 and ground potential in order to permit these transistors to be rapidly turned off at the termination of the input data pulse.

Light emitting diodes 120 and 121 are connected in series between the positive potential on terminal 108 and the collector of transistor 115. These LED's are polarized such that the well defined 80 ma. of current flowing into the collector of transistor 115 causes both diodes to be forward biased and emit light. The reason for driving two LED's is that one diode can advantageously be chosen to have a broad radiation pattern (to maximize ceiling scatter in rooms) while the other diode is chosen to have a highly directive pattern (to maximize long range line of sight communication). Both LED's have the same efficiency, so equal numbers of photons are launched into each radiation pattern on each input pulse, yielding a "football plus spike" optical power distribution.

What has been described herein above is merely an illustrative embodiment of the present invention. Numerous departures may be made by those skilled in the art without departing from the spirit and scope of the present invention. For example, in the case where the circuit is provided on an integrated circuit chip, instead of causing the resistors to have different values in order to create the multiplying effect, the resistors can have equal values and the multiplying effect can be provided by having transistors with different sized emitter areas. Transistor 111, for example, can be fabricated with an emitter area of six times that of the emitter area of transistor 106 and the resulting current mirror will still provide the same multiplying effect.

What is claimed is:

1. A circuit operable from a power supply for providing optical radiation in response to an input pulse, said circuit comprising first and second current mirrors each of which has an reference current input, an output, and a power input, means for generating a current at said reference current input of said first current mirror in response to said input pulse, means for connecting one terminal of said power supply to the power input of said first current mirror and the other terminal of said power supply to the power input of said second current mirror, means for coupling the current at the output of said first current mirror to the reference current input of said second current mirror, and light emitting means connected between said one terminal of said power supply and the output of said second current mirror; said first and second current mirrors each including first and second transistors each having emitter, base and collector electrodes; said first and second transistors of said first current mirror being of one conductivity type, and the first and second transistors of said second current mirror are of the opposite conductivity type.

2. A circuit operable from a power supply for providing optical radiation in response to an input pulse as defined in claim 1 wherein said first and second current mirrors each further include first and second resistors, said first resistor being connected between the emitter electrode of said first transistor and the power input of its respective current mirror, said second resistor being connected between the emitter electrode of said second transistor and the power input of its respective current mirror, and said second resistor is a fractional value of said first resistor.

3. A circuit operable from a power supply for providing optical radiation in response to an input pulse as defined in claim 2 wherein the base electrode of said first transistor is directly connected to the base electrode of said second transistor, and said first and second current mirrors each further include a third resistor connected between said base electrodes and the power input of its respective current mirror.

4. A circuit operable from a power supply for providing optical radiation in response to an input pulse as defined in claim 2 wherein said means for generating a current at said reference current input of said first current mirror in response to said input pulse includes a transistor of the opposite conductivity type having emitter, base and collector electrodes, said emitter electrode being directly connected to the other terminal of said power supply, means for connecting said input pulse to the base electrode of the transistor of said generating means, and means for connecting the collector electrode of the transistor of said generating means to the reference input of said first current mirror.

5. A circuit powered by a power supply for providing optical radiation in response to an input pulse comprising a transistor having base, emitter, and collector electrodes, means for coupling said input pulse to the base and emitter electrodes of said transistor with a polarity such that said transistor is driven into conduction, a first multiplying current mirror having an input, output, and power terminals, means for coupling said power terminal of said first multiplying current mirror to one terminal of said power supply, means for connecting said collector and emitter electrodes of said transistor between said input terminal of said first multiplying mirror and the other terminal of said power supply, a second multiplying current mirror having an input, output, and power terminals, means for connecting said output terminal of said first multiplying mirror to the input terminal of said second multiplying mirror, means for connecting the power terminal of said second multiplying current mirror to the other terminal of said power supply, and light emitting diode means connected between said one terminal of said power supply and the output terminal of said second multiplying current mirror; said first and second multiplying current mirrors each including first and second transistors each having emitter, base and collector electrodes; said first and second transistors of said first multiplying current mirror being of one conductivity type, and the first and second transistors of said second multiplying current mirror are of the opposite conductivity type.

6. A circuit powered by a power supply for providing optical radiation in response to an input data pulse as defined in claim 5 wherein said first and second multiplying current mirrors each further include first and second resistors, said first resistor being connected between the emitter electrode of said first transistor and the power input of its respective current mirror, said second resistor being connected between the emitter electrode of said second transistor and the power input of its respective current mirror, and said second resistor is a fractional value of said first resistor.

7. A circuit operable from a power supply for providing optical radiation in response to an input pulse, said circuit comprising a first transistor having an emitter, base, and collector with the base directly connected to the collector such that said first transistor functions as a diode, a first resistor connected between the emitter of said first transistor and one terminal of said power supply, a second transistor having an emitter, base, and collector, means for directly connecting the base of said first transistor to the base of said second transistor, a second resistor connected between the emitter of said second transistor and said one terminal of said power supply, means responsive to said input pulse for coupling a predetermined amount of current out of the collector of said first transistor to the other terminal of said power supply, light emitting diode means having an anode and a cathode for generating optical radiation in response to current passing from said anode through to said cathode, said anode being directly connected to said one terminal of said power supply, a third transistor having an emitter, base, and collector with the base directly connected to the collector such that said third transistor functions as a diode, a third resistor connected between the emitter of said third transistor and the other terminal of said power supply, a fourth transistor having an emitter, base, and collector, means for directly connecting the base of said third transistor to the base of said fourth transistor, a fourth resistor connected between the emitter of said fourth transistor and the other terminal of said power supply, and means for directly connecting the collector of said fourth transistor to the cathode of said light emitting diode means, the first and second transistors being of opposite conductivity type to that of said third and fourth transistors.

8. A circuit operable from a power supply for providing optical radiation in response to an input pulse as defined in claim 7 wherein a fifth resistor is connected between the base of said first transistor and said one terminal of said power supply, and a six resistor is connected between the base of said third transistor and said other terminal of said power supply.

9. A circuit operable from a power supply for providing optical radiation in response to an input pulse as defined in claim 7 wherein said means responsive to said input pulse for coupling a predetermined amount of current out of the collector of said first transistor to the other terminal of said power supply includes a fifth transistor having an emitter, base, and collector with the emitter connected directly to the other terminal of said power supply, means for coupling said input pulse to the base of said fifth transistor such that the input pulse drives said fifth transistor into saturation, and means for connecting the collector of said fifth transistor to the collector of said first transistor such that the collector current of said fifth transistor is drawn out of the collector of said first transistor.

* * * * *